(12) United States Patent
Whiting et al.

(10) Patent No.: US 9,305,807 B2
(45) Date of Patent: Apr. 5, 2016

(54) FABRICATION METHOD FOR MICROELECTRONIC COMPONENTS AND MICROCHIP INKS USED IN ELECTROSTATIC ASSEMBLY

(71) Applicant: Palo Alto Research Center Incorporated, Palo Alto, CA (US)

(72) Inventors: Gregory L. Whiting, Menlo Park, CA (US); Rene A. Lujan, Sunnyvale, CA (US); Eugene M. Chow, Fremont, CA (US); JengPing Lu, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 60 days.

(21) Appl. No.: 14/192,456

(22) Filed: Feb. 27, 2014

(65) Prior Publication Data

US 2015/0243528 A1    Aug. 27, 2015

(51) Int. Cl.
| | |
|---|---|
| *H01L 21/302* | (2006.01) |
| *H01L 21/461* | (2006.01) |
| *H01L 21/48* | (2006.01) |
| *H01L 21/78* | (2006.01) |
| *H01L 23/00* | (2006.01) |
| *H01L 21/67* | (2006.01) |

(52) U.S. Cl.
CPC .............. *H01L 21/481* (2013.01); *H01L 21/78* (2013.01); *H01L 24/95* (2013.01); *H01L 21/67132* (2013.01); *H01L 21/67271* (2013.01); *H01L 2924/12041* (2013.01)

(58) Field of Classification Search
CPC ...................... H01L 24/95; H01L 2224/95085; H01L 2224/95145; H01L 21/481; H01L 21/52; B81C 99/002
USPC .............................................. 438/736; 29/701
See application file for complete search history.

(56) References Cited

U.S. PATENT DOCUMENTS

| | | | |
|---|---|---|---|
| 3,439,416 A | 4/1969 | Yando | |
| 4,194,668 A | 3/1980 | Akyurek | |
| 4,458,297 A * | 7/1984 | Stopper et al. | ................ 361/771 |
| 4,542,397 A | 9/1985 | Biegelsen et al. | |
| 5,034,802 A | 7/1991 | Liedes, Jr. et al. | |
| 5,159,392 A | 10/1992 | Kasahara et al. | |
| 5,355,577 A | 10/1994 | Cohn | |
| 5,468,597 A * | 11/1995 | Calabrese et al. | ............ 430/315 |
| 5,545,291 A | 8/1996 | Smith et al. | |
| 5,666,147 A | 9/1997 | Larson | |

(Continued)

*Primary Examiner* — Caridad Everhart
(74) *Attorney, Agent, or Firm* — Bever, Hoffman & Harms, LLP

(57) ABSTRACT

Charge-encoded chiplets are produced using a sacrificial metal mask and associated fabrication techniques and materials that are compatible with typical semiconductor fabrication processes to provide each chiplet with two different (i.e., positive and negative) charge polarity regions generated by associated patterned charge-inducing material structures. A first charge-inducing material having a positive charge polarity is formed on a silicon wafer over previously-fabricated integrated circuits, then a sacrificial metal mask is patterned only over a portion of the charge-inducing material structure, and a second charge-inducing material structure (e.g., a self-assembling octadecyltrichlorosilane monolayer) is deposited having a negative charge polarity. The sacrificial metal mask is then removed to expose the masked portion of the first charge-inducing material structure, thereby providing the chiplet with both a positive charge polarity region and a negative charge polarity region.

15 Claims, 7 Drawing Sheets

(56) References Cited

U.S. PATENT DOCUMENTS

| | | |
|---|---|---|
| 5,783,856 A | 7/1998 | Smith et al. |
| 5,824,186 A | 10/1998 | Smith et al. |
| 5,904,545 A | 5/1999 | Smith et al. |
| 5,988,794 A | 11/1999 | Takagi |
| 6,696,225 B1 * | 2/2004 | Kanbe et al. .................. 430/320 |
| 6,733,868 B1 * | 5/2004 | Kanbe et al. ................ 428/195.1 |
| 6,796,867 B2 | 9/2004 | George et al. |
| 7,035,575 B2 | 4/2006 | Ikeguchi et al. |
| 7,332,361 B2 | 2/2008 | Lu et al. |
| 7,861,405 B2 | 1/2011 | Chow et al. |
| 8,082,660 B2 | 12/2011 | Lu et al. |
| 8,181,336 B2 | 5/2012 | Chow et al. |
| 8,312,619 B2 | 11/2012 | Chow et al. |
| 2006/0128057 A1 | 6/2006 | Lu et al. |
| 2008/0089705 A1 | 4/2008 | Lu et al. |
| 2009/0315017 A1 * | 12/2009 | Song .............................. 257/24 |
| 2010/0186221 A1 | 7/2010 | Chow et al. |
| 2010/0192365 A1 | 8/2010 | Chow et al. |
| 2012/0297618 A1 | 11/2012 | Lu et al. |

* cited by examiner

US 9,305,807 B2

FABRICATION METHOD FOR MICROELECTRONIC COMPONENTS AND MICROCHIP INKS USED IN ELECTROSTATIC ASSEMBLY

STATEMENT REGARDING FEDERALLY SPONSORED RESEARCH OR DEVELOPMENT

This invention is based upon work supported by DARPA under Contract No. W91CRB-12-C-0006. Therefore, the Government has certain rights to this invention

FIELD OF THE INVENTION

The present invention is directed to electrostatic assembly processes in which electronic assemblies are produced using electrostatic fields to manipulate (i.e., orientate and position) charge-encoded microelectronic components ("chiplets") dispersed in a solution ("microchip ink"), and in particular to cost-effective methods for fabricating the charge-encoded chiplets and producing the microchip inks used in xerographic micro-assembler systems.

BACKGROUND OF THE INVENTION

FIG. 7 is a simplified representation of a xerographic micro-assembler 10 similar to that disclosed in U.S. Pat. No. 7,332,361 ("Xerographic Micro-Assembler", which is assigned to the assignee of the present invention, and incorporated herein by reference in its entirety), and represents one type of system that performs an electrostatic assembly process. Xerographic micro-assembler 10 generally includes a sorter 40 and an image transfer unit 50. Sorter 40 includes a container 41 holding a microchip ink 20 comprising micro-objects (chiplets) 30 that are suspended in carrier solution (i.e., a mixture of non-polar liquid and charge-control agents). Sorting unit 40 further includes a conveying unit 43 having one end extending into microchip ink 20, and a second end disposed adjacent to a transfer drum 51 of image transfer unit 50. Microchip ink 20 resembles the liquid developer found in some conventional xerographic copiers and printers, but differs in that chiplets 30 (which are generally analogous to toner particles) are charge-encoded in a way that identifies each chiplet 30 and specifies its orientation such that, during the sorting process, chiplets 30 are manipulated within microchip ink 20 such that they assume associated defined positions and orientations on conveying unit 43 (e.g., as indicated by chiplets 30A in FIG. 7). That is, sorting unit 40 has the capability of electrostatically and magnetically manipulating chiplets 30 based on their individual charge encoding by way of a dynamic electrostatic field applied to conveyor member 43 by an associated controller (not shown), and to cause chiplets 30 to adhere to conveyor member 43 at designated locations and with select orientations. Chiplets 30 are then transferred in to rotating transfer drum 51, whose outer surface is processed by an image writer 53 to carry an electrostatic image that holds chiplets 30 in locations and orientations related to that established on conveyor member 43 (e.g., as indicated by chiplets 30B in FIG. 7). Chiplets 30 are then transferred from rotating transfer drum 51 onto a substrate (e.g., a printed circuit board) 60 at locations and orientations related to those established on conveyor member 43 and drum 51 (e.g., as indicated by chiplets 30C in FIG. 7). Substrate 60 is then transferred from image transfer unit 50 for post processing to interconnect chiplets 30 (e.g., by way of electrical wiring) to form the final electronic micro-assembly device.

In order to provide the necessary inks for the micro-assembler, a reliable method compatible with conventional semiconductor processing is needed for producing arbitrary charge patterns on the chip surface. A significant challenge is to design a process which protects the patterned material that provides the charge encoding. Furthermore, an ideal process and material set would be independent of the underlying device, so would be applicable to chiplets containing any functionality, such as CMOS circuitry, sensors, LEDs, etc. In addition to the charge pattern itself, the process should also provide for interconnection to underlying circuitry and singulation into small chiplets. As such, a materials set must be selected that allows for this functionality (charge pattern, interconnection and singulation) without any damage caused either to the underlying chip or the deposited layers in the stack.

What is needed is a method for producing microchip inks including microelectronic components (chiplets) that are optimized for electrostatic assembly. What is particularly needed are low-cost methods for producing charge-encoded chiplets used in electrostatic assembly.

SUMMARY OF THE INVENTION

The present invention is directed to methods for producing charge-encoded microelectronic components (chiplets) in which patterned charge-inducing material structures are formed on each chiplet using a sacrificial metal mask and associated fabrication techniques and materials that are compatible with typical semiconductor fabrication processes (e.g., CMOS), thereby minimizing manufacturing costs, and more importantly, broadening the scope of applicability for the micro-assembler (i.e., to provide a diverse set of inks for the micro-assembler to make it as broadly applicable as possible). The present invention is also directed to methods for producing microchip inks that include these charge-encoded chiplets in a manner than facilitates electrostatic assembly using, for example, a xerographic micro-assembler system.

According to an aspect of the present invention, the charge-encoded chiplets to which the novel methodology is directed are characterized by being very small (i.e., having a semiconductor "chip" size in the range of 5 to 1000 microns laterally, and 50 microns or less in thickness), and by including patterned charge-inducing material structures disposed on one surface thereof using the methods described herein such that the patterned charge-inducing material structures provide each chiplet with two or more different (e.g., positive, negative, or a pattern of positive and negative) polarity regions, thereby facilitating sorting and alignment of each chiplet within a microchip ink during an electrostatic assembly process.

According to an exemplary embodiment, after forming integrated circuits (ICs) on a wafer and forming optional (e.g., TiW or Al) interconnect structures (contact pads) on an upper surface over the integrated circuit using standard semiconductor processing equipment, the same standard semiconductor processing equipment is utilized to generate patterned charge-inducing material structures over each IC. First, a first charge-inducing material structure on the upper surface over each IC, where the first charge-inducing material (e.g., a hydrophilic material, preferably $SiO_2$) has a first surface chemistry that exhibits a first (e.g., positive) charge polarity. Next, a sacrificial metal mask (e.g., MoCr) is patterned only over a portion of the charge-inducing material structure (i.e., such that a portion of the first charge-inducing material structure remains exposed). A second charge-inducing material structure (e.g., a self-assembling monolayer consisting essentially of a hydrophobic material such as octadecyltrichlorosilane (OTS)) is formed over the upper surface, whereby a surface chemistry of the exposed portion of the first charge-inducing material structure is changed by the second charge-inducing material structure to a second (e.g., negative) charge polarity. Finally, the sacrificial metal mask is removed, thereby exposing the masked portion of the charge-inducing material structure, which retains the first (e.g. positive) charge polarity, whereby the upper surface is charge-encoded by including at least one positive charge polarity region and at least one negative charge polarity region. Because each of the additional processes mentioned above is easily achieved using standard semiconductor processing equipment (e.g., by modifying an existing CMOS process flow to include the additional processes mentioned above), the present invention facilitates the low-cost fabrication of charge-encoded chiplets that are optimized for electrostatic assembly using a xerographic micro-assembler.

According to another exemplary embodiment, the process described above is further modified to simultaneously produce a large number of chiplets that are then released into a fluid to form a microchip ink suitable for electrostatic assembly using a xerographic micro-assembler. To facilitate singulation of a wafer into a large number of individual chiplets, a singulation etch mask is formed over each IC 105 after formation of the sacrificial metal mask is completed. The wafer is then bonded to a carrier substrate using a suitable temporary mounting adhesive, and then singulation is carried out using standard processes (e.g., using a $CF_4/O_2$ plasma or deep reactive ion etching (RIE)) to form separate chiplets that remain secured to the carrier substrate. In addition to using a thinned wafer and a rigid carrier, other approaches can also be taken for final chip release, such as polishing if a thick wafer is used or an oxide etch if an SOI wafer is used. The singulation etch mask is then removed to expose the upper surface for subsequent formation of the second charge-inducing material structure and removal of the sacrificial metal mask in the manner mentioned above. Because each of the additional processes mentioned above is easily achieved using the same standard semiconductor processing equipment used to generate the ICs, the present invention facilitates the fabrication of charge-encoded chiplets in large numbers, further minimizing manufacturing costs as well as being useful for a large number of different chip types. Also, importantly, the materials and etchants are carefully chosen so that they can be used to generate the necessary stack of materials (interconnects to underlying electronics, arbitrary charge-inducing pattern, and singulation) in a way that is internally compatible as well as compatible with any underlying chip. To generate the desired microchip ink, the chiplets are released from the carrier substrate using a suitable solvent (e.g., acetone), and then added to a suitable solution (e.g., 0.1% solution of sodium dioctyl sulfosuccinate (AOT) in isopar M), thereby forming a microchip ink that is optimized for use in a xerographic micro-assembler. Further, because the chiplets remain attached together and in-plane until release, the above methodology enables inspection of the chiplets throughout the fabrication process.

According to a presently preferred embodiment, the various materials and etchants utilized to generate the patterned charge-inducing material structures are selected so as not to damage the previously formed structures. In a specific embodiment, the optional interconnect structures are formed using an Al or TiW alloy, the first charge-inducing material structure comprises $SiO_2$, the sacrificial metal mask is formed using MoCr alloy, the singulation etch mask comprises a patterned layer of Ni, and the second charge-inducing material structure is a self-assembling monolayer comprising OTS. The use of $SiO_2$, TiW, Ni and OTS is currently preferred because each of these materials have etchants that meet the above criteria (i.e., $SiO_2$ has an etchant that does not damage the metal interconnect layer (TiW, Al, etc,), Ni has an etchant that does not damage MoCr, interconnect metal or $SiO_2$, and MoCr has an etchant that does not damage the interconnect metal (TiW or Al), $SiO_2$ or OTS. Therefore, implementing the method described above using the specific materials TiW/Al, $SiO_2$, MoCr, Ni and OTS further enhances the ability of the present invention to produce charge-encoded chiplets using materials and techniques that are compatible with standard semiconductor fabrication processes.

Various alternatives to the methodology described above are introduced that retain the spirit and scope of the present invention. For example, although the use of TiW/Al, $SiO_2$, MoCr, Ni and OTS is presently preferred for the reasons set forth above, it is possible to utilize the described methodology using other materials that facilitate the objectives set forth above. In addition, singulation and release of the chiplets from a carrier substrate may be conducted prior to formation of the second charge-inducing material structure (i.e., after removal of the sacrificial metal mask). In this case, after the the sacrificial mask is in place, the self-assembled monolayer is then deposited by dispersing the chiplets in a suitable solution containing, for example, OTS, followed by subsequent removal of the sacrificial metal (e.g., MoCr) mask using a suitable etchant disposed in a second solution. This approach has the benefit, if desired, of allowing the chiplets to be fully coated with the self-assembled monolayer (except in the region where the MoCr mask was subsequently removed), but has the potential drawback of making inspection of the chiplets more difficult during the final process steps, as well increasing the chance of possible damage due to collisions in the solutions.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improved method for producing charge-encoded microelectronic component "chiplets" that are optimized for xerographic micro-assembler operations. The following description is presented to enable one of ordinary skill in the art to make and use the invention as provided in the context of a particular application and its requirements. As used herein, directional terms such as "upper" and "lower" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
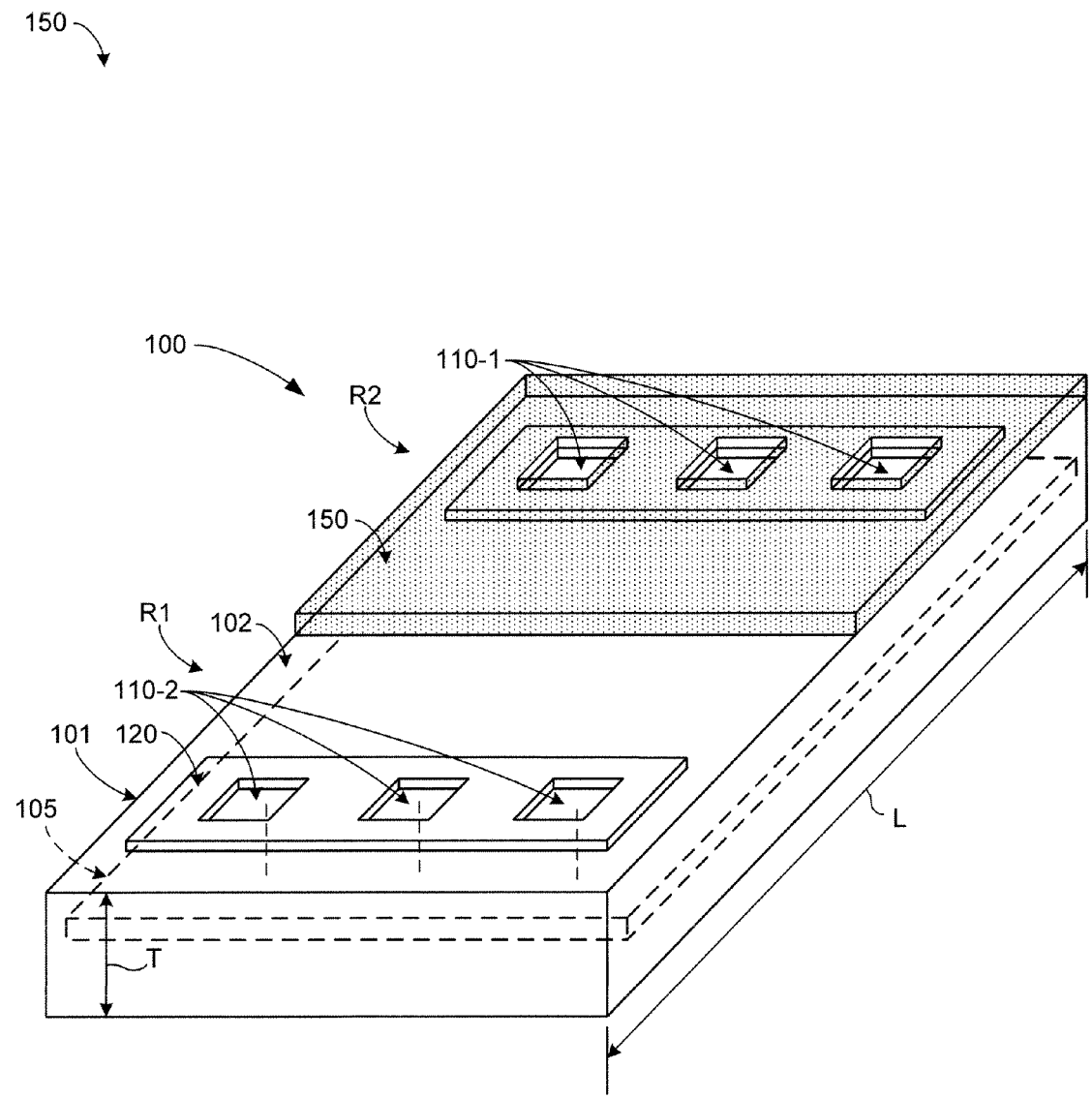
FIG. 1 is a top plan view showing a simplified charge-encoded microelectronic component "chiplet" produced in accordance with a simplified exemplary embodiment of the present invention.

FIG. 1 is a top plan view showing a simplified charge-encoded microelectronic component "chiplet" 100 produced in accordance with a simplified exemplary embodiment of the present invention. As defined herein, the terms "microelectronic component" and "chiplet" describe an electronic device fabricated on a semiconductor "chip" (e.g., silicon substrate, part of a silicon wafer) 101 having a maximum lateral size dimension L in the range of 5 to 1000 microns, and having a thickness T of 100 microns or less. Chiplet 100 is further characterized as including a functional integrated circuit (IC) 105 fabricated on chip 101 using known semiconductor processing techniques (e.g., complementary metal-oxide-semiconductor (CMOS)), where IC 105 is configured to perform one or more electronic (e.g., sensor, processor, or light-emitting diode) functions according to known circuit design techniques. Chiplet 100 further includes optional metal interconnect structures (contact pads) 110-1 and 110-2, which are exposed through via openings and formed on an upper surface 102 of chiplet 100 using known semiconductor processing techniques, that facilitate the electronic interconnection between IC 105 and other chiplets or larger devices (not shown) in a microelectronic or electronic system. Accordingly, when the terms "microelectronic component" and "chiplet" are used herein and in the appended claims, it is understood that these terms refer to a semiconductor "chip" having the dimensions defined above and including at least one integrated circuit formed thereon.

According to an aspect of the present invention, in order to facilitate electrostatic control over chiplet 100 during electrostatic assembly (e.g., using the system shown in FIG. 7 and described above), chiplet 100 is further characterized by including two or more charge-inducing material structures that are patterned on upper surface 102 in a manner that allows access to contact pads 110-1 and 110-2 during assembly. According to an embodiment of the present invention, the two or more charge-inducing material structures include a hydrophobic (first) charge-inducing material structure 120 and a hydrophilic (second) charge-inducing material structure 150. The present inventors have observed that, when placed in a solution of AOT, hydrophobic and hydrophilic regions charge up in opposite ways (i.e., one positive charge and one negative charge). Therefore, when formed using hydrophobic and hydrophilic materials, respectively, charge-inducing materials 120 and 150 generate two different (i.e., positive and negative) polarity regions R1 and R2 that facilitate sorting and alignment of chiplet 100 within a microchip ink during an electrostatic assembly process. In the exemplary embodiment, each of the two different (positive/negative) polarity regions R1 and R2 generally occupies an associated half of upper surface 102. As described above, this arrangement facilitates electrostatic assembly by facilitating automatic alignment of chiplet 100 over a corresponding contact area on, for example, an electrode array during the electrostatic assembly process introduced above with reference to the system shown in FIG. 7. However, it is noted that the particular arrangement depicted in the figures is not intended to be limiting, and that any arbitrary patter of the charge inducing materials could be used. In addition, although hydrophobic and hydrophilic materials are used to facilitate the desired opposite charging of regions R1 and R2, other materials exhibiting similar charging characteristics may be used.

As set forth in the exemplary embodiment described below with reference to FIGS. 2(A) to 2(K), a solution-based ink is produced for an electrographic micro-assembler that contains multiple chiplets 100 (see FIG. 1). In this embodiment, the charging pattern is defined using a sacrificial metal mask (e.g., MoCr alloy) that facilitates the patterning of a self-assembled monolayer (e.g., octadecyltrichlorosilane (OTS)) onto exposed portions of the underlying substrate surface material (e.g., $SiO_2$). That is, the sacrificial metal mask protects portions of the underlying $SiO_2$ so that, when the sacrificial metal mask is etched away, a surface energy pattern of either OTS coated $SiO_2$ or bare $SiO_2$ is generated, thereby providing positive and negative polarity regions R1 and R2.

Figure 2A:
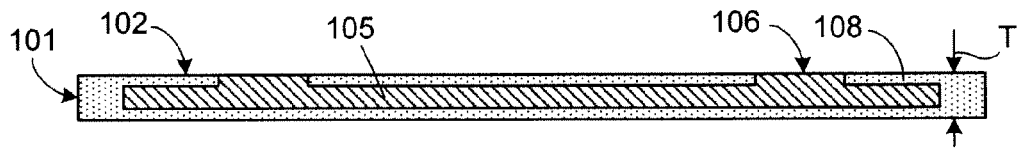
FIGS. 2(A), 2(B), 2(C), 2(D), 2(E), 2(F), 2(G), 2(H), 2(I), 2(J), 2(K) and 2(L) are simplified partial cross-sectional side views showing a method for producing the chiplet of FIG. 1 according to an exemplary embodiment of the present invention.
Figure 3:
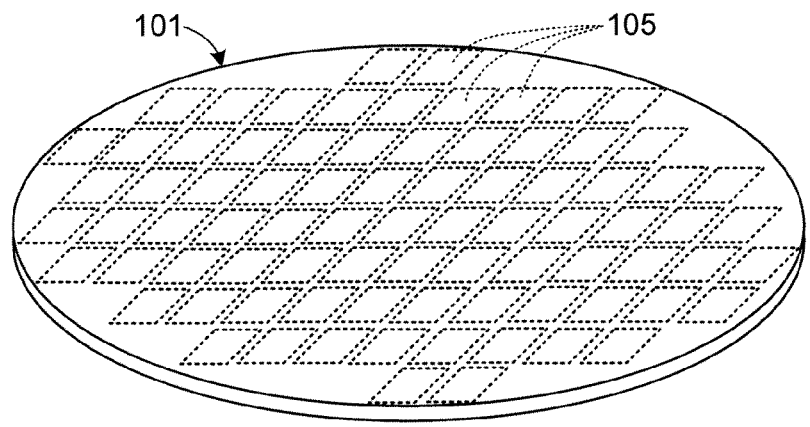
FIG. 3 is a simplified perspective view showing a processed wafer utilized in the exemplary method of FIGS. 2(A) to 2(L)

FIG. 2(A) is a cross-sectional view showing a portion of a semiconductor (e.g., monocrystalline silicon) wafer 101 having formed thereon an integrated circuit (IC) 105 using standard semiconductor processing equipment and techniques (e.g., a standard 0.018μ CMOS process flow and associated equipment). As indicated in FIG. 3, wafer 101 is a standard (e.g., substantially round) wafer on which multiple IC circuits 105 (not drawn to scale) are simultaneously fabricated using known techniques in a spaced-apart relationship. The electronic function performed by each IC 105 during operation (e.g., sensor, processor, LED) is not relevant to the present invention, but the size (area) of each IC 105 is understood to be within the range described above. Returning to FIG. 2(A), at this point of the process, wafer 101 has already been thinned to thickness T (i.e., in range of 25 to 50 μm) using known techniques. Note that upper surface 102 of substrate 101 is processed using known techniques to include exposed contact pads 106, which provide electrical connection to IC 105, that are exposed through an upper passivation layer 108.

Figure 2B:
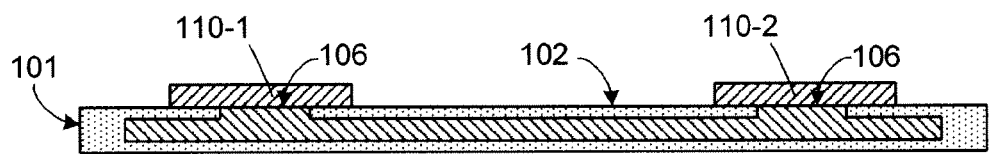

FIG. 2(B) shows wafer 101 after optional interconnect structures 110-1 and 110-2 are fabricated on upper surface 102 over exposed contact pads 106, which are then covered and exposed through corresponding via holes (openings). Interconnect structures 110-1 and 110-2 (e.g., Titanium-Tungsten (TiW) or Aluminum (Al)) are sputtered and patterned using standard photolithography techniques. In an alternative embodiment, separate interconnect structures are omitted, and electrical connections are made directly to exposed contact pads 106.

Figure 2C:
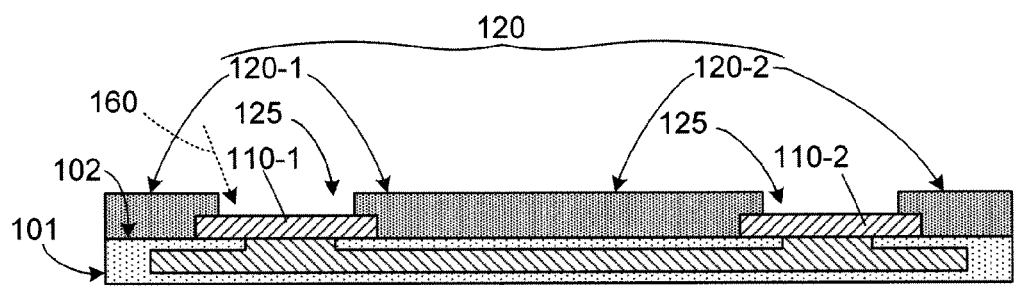

FIG. 2(C) shows wafer 101 after a first charge-inducing material structure 120 is formed on upper surface 102. In one embodiment, first charge-inducing material structure 120 is a patterned hydrophilic material having a (first) surface chemistry exhibiting a first (e.g., positive) charge polarity. In a particular embodiment, first charge-inducing material structure 120 comprises $SiO_2$ that is deposited as a blanket layer having a thickness in the range of 10 and 1000 nanometers using plasma enhanced chemical vapor deposition (PECVD)), and then patterned using a suitable etchant 160 (e.g., a buffered oxide etchant (BOE) or buffered HF solution) to define holes 125 that allow connection to IC 105 (e.g., by way of interconnect structures 110-1 and 110-2). In alternative embodiments, other insulating metal oxides (e.g., aluminum oxide or titanium oxide) may be used in place of $SiO_2$. For descriptive reasons that will become clear below, first charge-inducing material structure 120 is depicted as including two portions 120-1 and 120-2, but at the point illustrated in FIG. 2(C) there are no physical differences between the two portions.

Figure 2D:
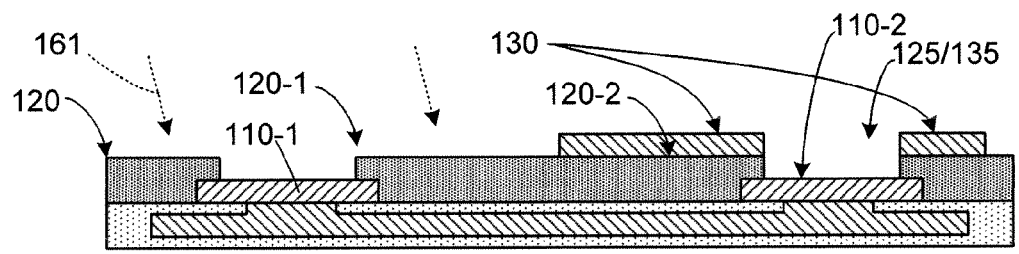

FIG. 2(D) shows the structure of FIG. 2(C) after the subsequent deposition and patterning of a sacrificial metal mask 130 on portion 120-2 of first charge-inducing material structure 120, where sacrificial metal mask 130 serves to define the charge-inducing material regions of the completed chiplet in the manner described below. According to an embodiment of the present invention, sacrificial metal mask 130 comprises a Molybdenum-Chromium (MoCr) alloy that is deposited (e.g., by way of sputtering or evaporation) to form a layer having a thickness in the range of 5 to 500 nanometers, and then etched using etchant 161 (e.g., a ceric ammonia nitrate based etchant) to remove metal from "exposed" portion 120-1 of first charge-inducing material structure 120 (e.g., patterned MoCr mask 130 covers approximately 50% of the chip area occupied by IC 105, but this 50/50 pattern is not essential, and any arbitrary pattern may be used), and such that an opening 135 aligns with opening 125 through portion 120-2 to expose interconnect structure 110-2.

Figure 2E:
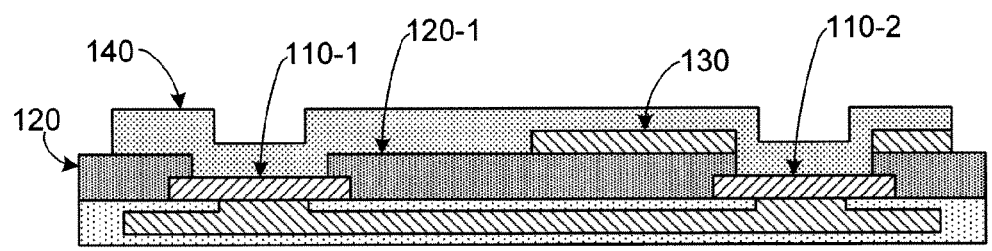

FIG. 2(E) shows the structure of FIG. 2(D) after a singulation etch mask 140 is formed exposed portion 120-1 of first charge-inducing material structure 120, sacrificial metal mask 130, and interconnect structures 110-1 and 110-2. In order to facilitate a deep plasma etch through wafer 101 to singulate the chiplets, singulation etch mask 140 is a hard mask formed by sputtered nickel having a thickness in the range of 20 to 2000 nanometers that is subsequently etched using TFG produced by Transene Company, Inc. of Danvers, Mass., USA, which contains thiourea, sodium n-nitrobenzenesulfonate and sulfuric acid in water.

Figure 2F:
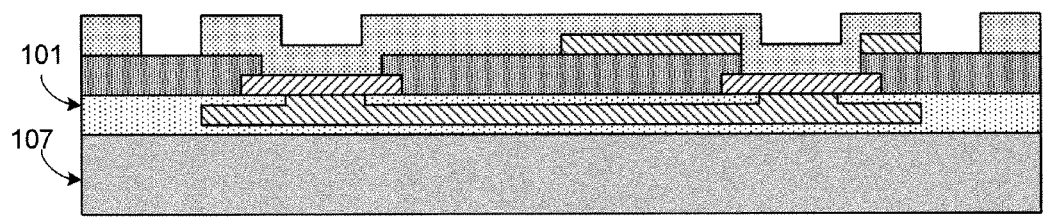

FIG. 2(F) shows the structure of FIG. 2(E) after wafer (substrate) 101 is bonded to a carrier substrate 107 using a suitable temporary mounting adhesive (e.g., Crystalbond™, produced by Aremco Products, Inc. of Valley Cottage, N.Y., USA). The carrier substrate is not necessary if wafer 101 is to be later thinned, or if electronics are built on an SOI wafer.

Figure 2G:
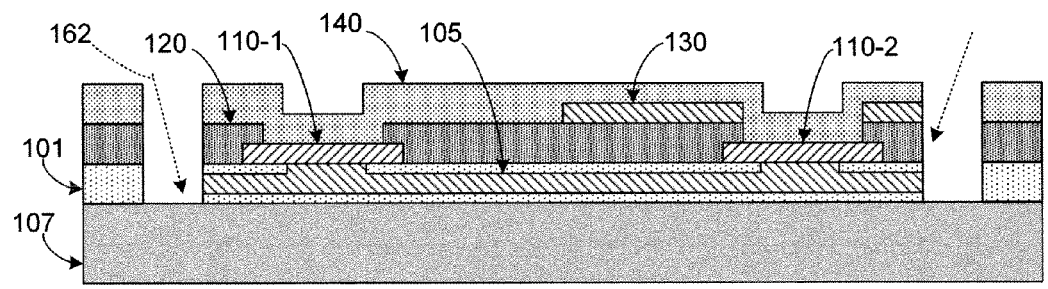
Figure 5:
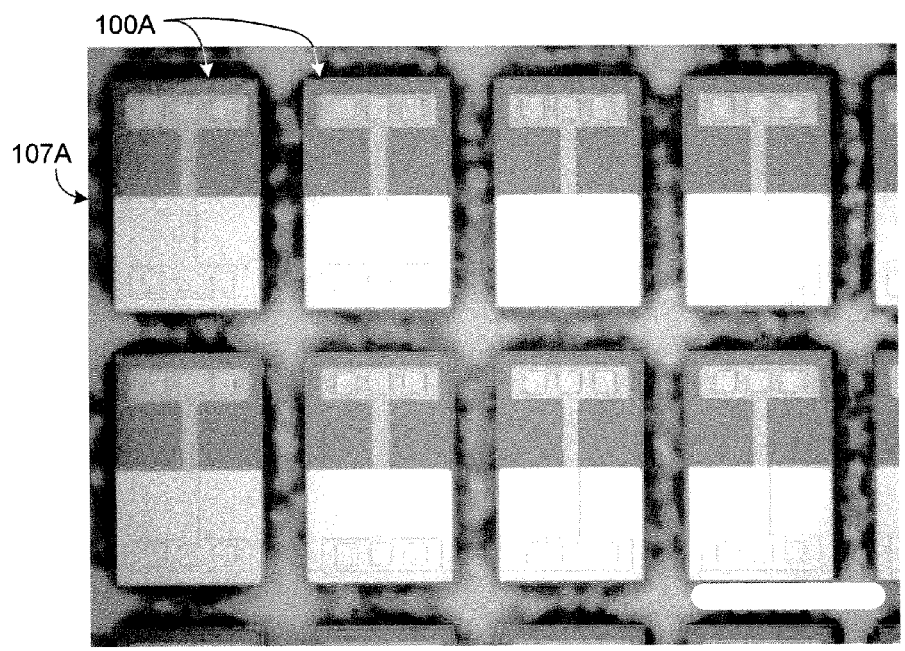
FIG. 5 is an enlarged photograph showing an array of chiplets on a carrier substrate after singulation in accordance with a practical embodiment.

FIG. 2(G) depicts the singulation of (i.e., etching through) wafer 101 using a suitable etchant 162 (e.g., using a $CF_4/O_2$ plasma, or using deep reactive ion etching (RIE)) in a peripheral region surrounding each IC 105 to form separate chiplets 100 that remain secured to carrier substrate 107. Note that singulation etch mask 140 protects the various uppermost structures of each chiplet 100 (e.g., interconnect structures 110-1 and 110-2, first charge-inducing material structure 120 and sacrificial metal mask 130) during singulation. FIG. 5 is an enlarged photograph showing an array of chiplets 100A on a carrier substrate 107A after singulation in accordance with a practical embodiment (scale bar=200 μm).

Figure 2H:
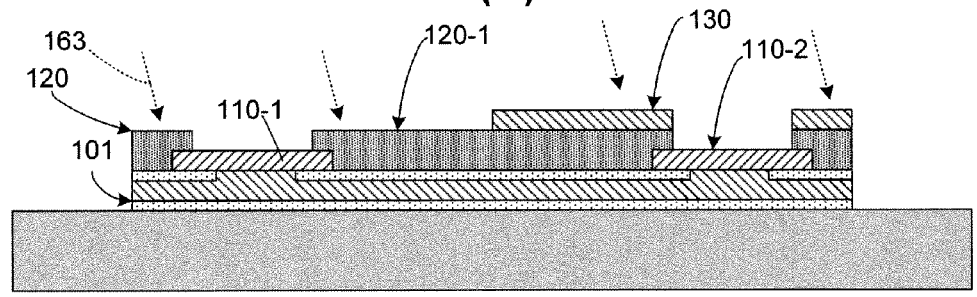

FIG. 2(H) shows the subsequent removal of the singulation etch mask, thereby re-exposing sacrificial metal mask 130 and exposed portion 120-1 of first charge-inducing material structure 120 disposed around interconnect structures 110-1. In one embodiment, the singulation etch mask comprises Ni, and an etchant 163 used to remove the singulation etch mask is TFG produced by Transene Company, Inc.

Figure 2I:
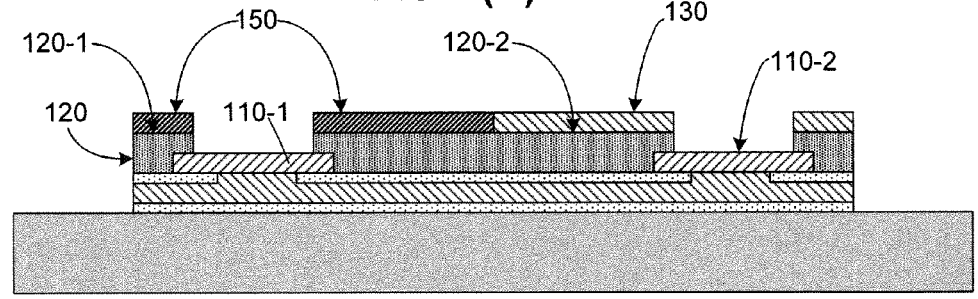
Figure 4A:
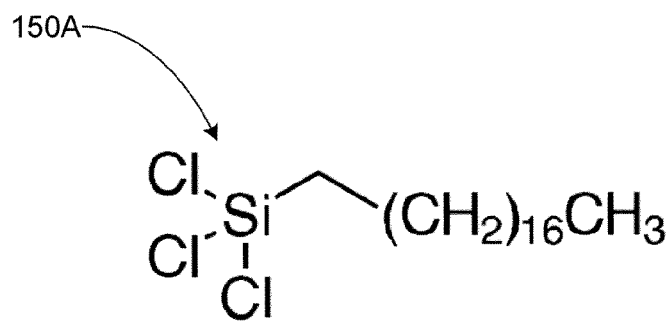
FIGS. 4(A) and 4(B) are diagrams including exemplary skeletal formulas associated with materials utilized in the exemplary method of FIGS. 2(A) to 2(L) according to associated specific embodiments.

FIG. 2(I) shows the subsequent deposition of a second charge-inducing material structure 150 on exposed portion 120-1 of first charge-inducing material structure 120, wherein second charge-inducing material structure 150 comprises a hydrophobic material having a different (second) surface chemistry (i.e., in comparison to the material forming first charge-inducing material structure 120), and exhibiting a second (e.g., negative) charge polarity. In the exemplary embodiment, second charge-inducing material structure 150 comprises a self-assembling monolayer made up of a hydrophobic aliphatic material (e.g., a layer of octadecyltrichlorosilane (OTS) having a monolayer thickness, which is deposited by immersion of wafer 101 in a dilute solution of OTS in toluene). In another embodiment, second charge-inducing material structure 150 comprises a self-assembling layer having a thickness of 20 nm or less, or may utilize a material that is not self-assembling. FIG. 4(A) shows a skeletal formula 150A for an OTS-based charge-inducing material structure according to the exemplary embodiment. Referring again to FIG. 2(I), note that sacrificial metal mask 130 serves to prevent the formation of second charge-inducing material structure 150 over portion 120-2 of first charge-inducing material structure 120.

Figure 2J:
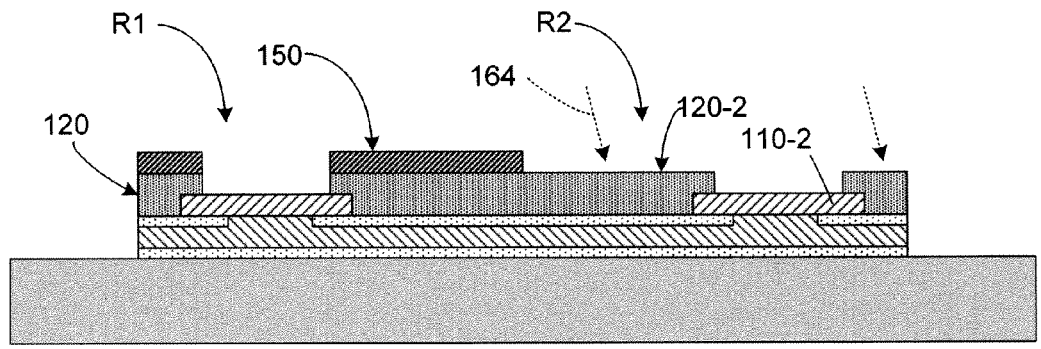

FIG. 2(J) shows the subsequent removal of the sacrificial metal mask from portion 120-2 of first charge-inducing material structure 120, whereby upper surface 102 is provided with a first region R1 having the first (e.g., positive) charge polarity generated by second charge-inducing material structure 150, and a second region R2 having the second (e.g., negative) charge polarity generated by exposed portion 120-2 of first charge-inducing material structure 120. In an exemplary embodiment in which the sacrificial metal mask material is MoCr, this mask removal process utilizes an etchant 164 (e.g., a ceric ammonium nitrate based etchant).

Figure 2K:
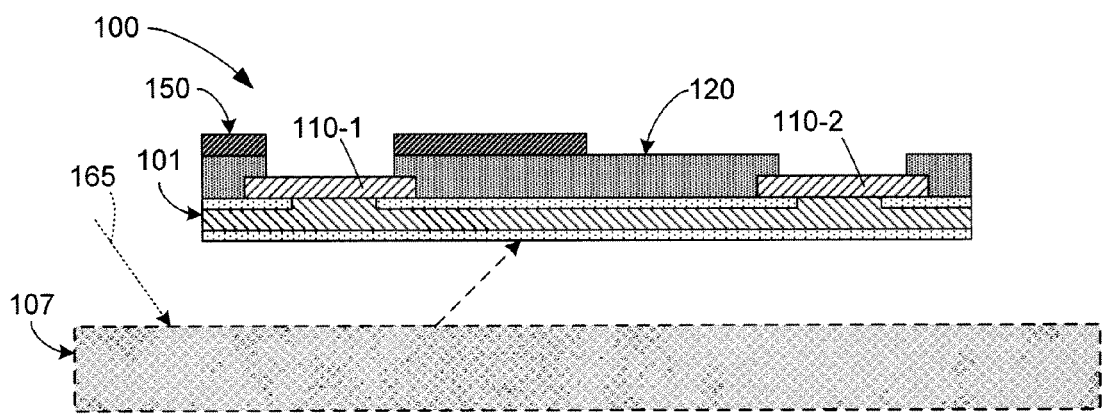

FIG. 2(K) shows the subsequent release (separation) of chiplet 100 from carrier substrate 107. In an exemplary embodiment in which the temporary adhesive used to secure the wafer to carrier substrate 107 is Crystalbond, the separation process involves using a suitable solvent 165 such as acetone.

Figure 2L:
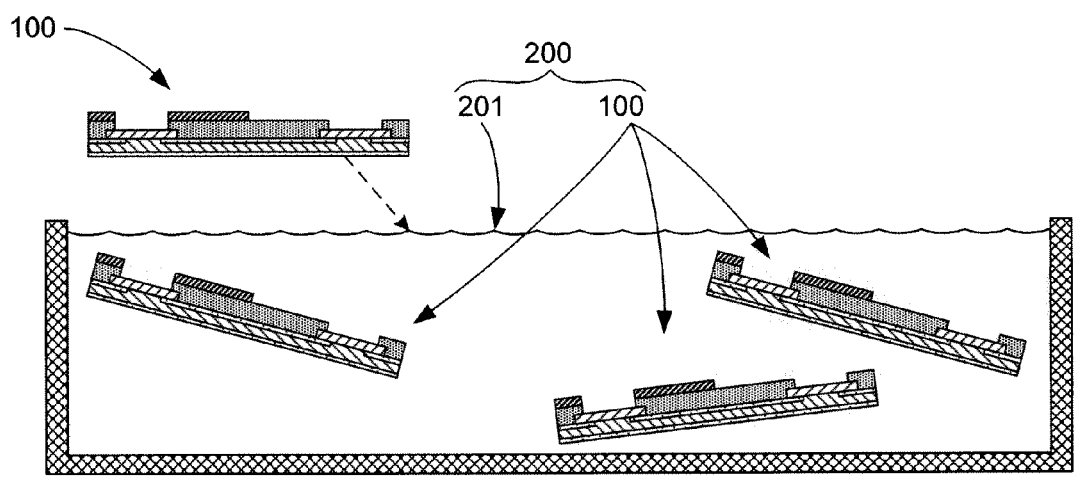
Figure 4B:
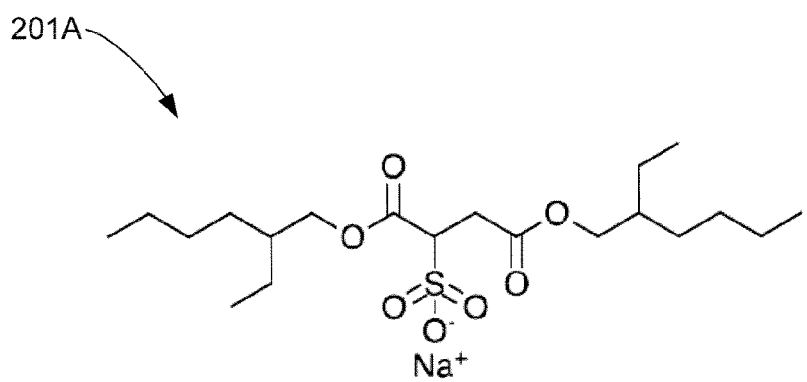
Figure 7:
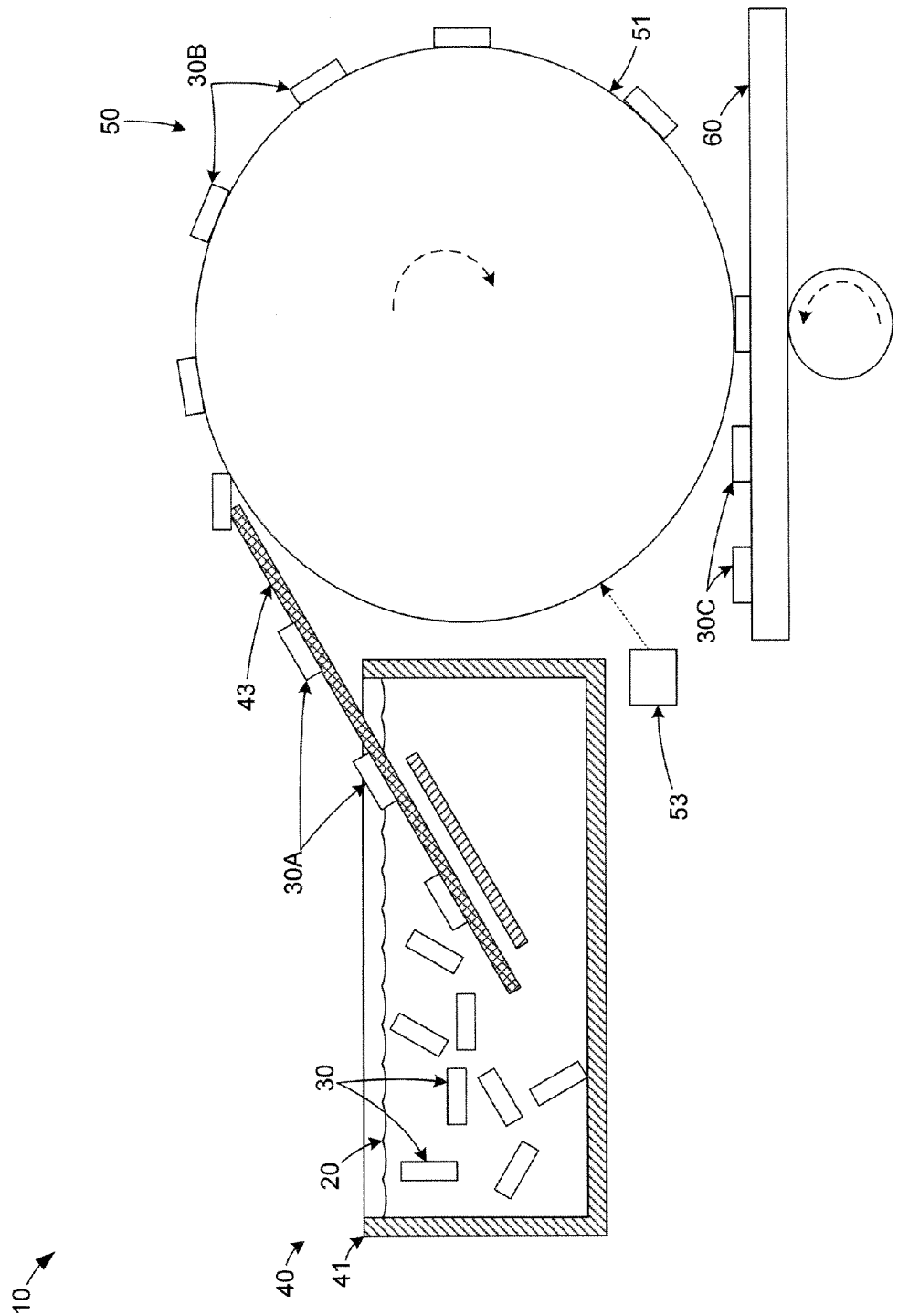
FIG. 7 is a simplified diagram showing a xerographic micro-assembler system.

FIG. 2(L) shows the subsequent addition of released chiplets 100 into a carrier solution 201, thereby forming the final ink 200 to be used in a xerographic (electrographic) microassembler (such as that shown in FIG. 7). In an exemplary embodiment, carrier solution 201 is a 0.1% solution of sodium dioctyl sulfosuccinate (AOT) in isopar M. FIG. 4(B) shows a skeletal formula 201A for AOT used in the exemplary embodiment. The use of this carrier solution is important because the isopar is a non-polar solvent that enables longer range Coluomb interactions (minimal screening) and shouldn't damage the electronics, and the AOT is a charge-control agent that creates inverse micelles in the fluid which interact with the surface of the chip to generate charge (based on the surface chemistry of the chip). This approach is utilized in liquid toners or electrophoretic displays, where surfactants are used to generate free charge in non-polar solvents.

According to an aspect of the exemplary embodiment described above with reference to FIGS. 2(A) to 2(L), the methodology of the present invention is compatible with typical semiconductor processing (e.g., a standard CMOS flow), and can therefore be carried out during the fabrication of the microelectronic components themselves using the same semiconductor processing equipment used to fabricate IC 105. As with any similar process, material and etchant selection is critical. For example, the $SiO_2$ etch must not damage the metal interconnect layer (TiW, Al, etc,), the Ni etch must not damage MoCr, interconnect metal or $SiO_2$, and the MoCr etch must not damage the interconnect metal (TiW or Al), SiO₂ or OTS. In the exemplary embodiment, the use of SiO₂, TiW or Al, Ni, SiO₂ and OTS is currently preferred because these materials have etchants that meet the above criteria (i.e., etchants for these materials are available that do not damage underlying materials), thereby providing a method for creating chiplets with connections to underlying functionality and bearing the required surface energy pattern using materials and techniques that are compatible with standard semiconductor process flows, such as standard CMOS process flows.

Figure 6A:
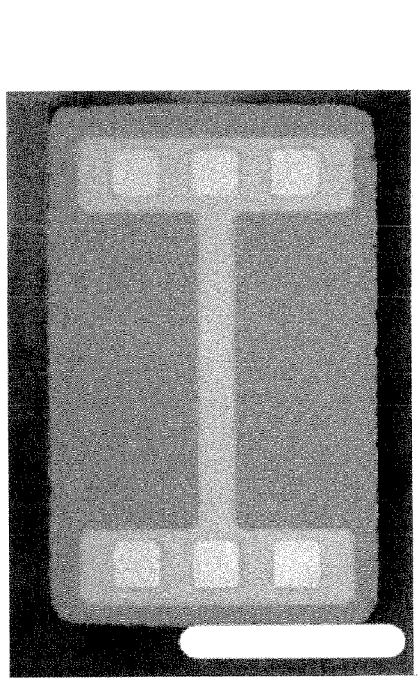
FIGS. 6(A) and 6(B) are enlarged photographs showing a completed, separated chiplet produced in accordance with the method of FIGS. 2(A) to 2(L)
Figure 6B:
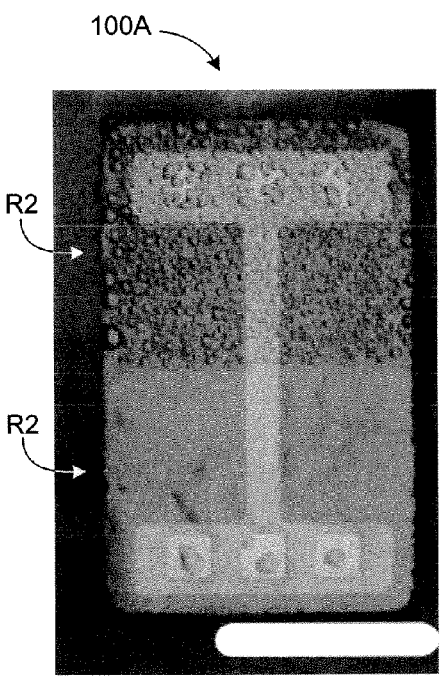

FIGS. 6(A) and 6(B) are enlarged photographs showing a completed, separated chiplet 100A produced in accordance with the method described above with reference to FIGS. 2(A) to 2(L) (scale bar=100 µm). FIG. 6(B) shows chiplet 100A in a "dry" state, and FIG. 6(B) shows chiplet 100A including condensed water, demonstrating hydrophobic region R1 and hydrophilic region R2 defined by the surface energy difference between the first (hydrophilic) charge-inducing material structure (e.g., SiO₂) and the second (hydrophobic) charge-inducing material structure (e.g., OTS).

In the exemplary embodiment described above, the semiconductor fabrication process is carried out entirely on one side of the silicon wafer (i.e., per standard CMOS fabrication techniques). In this case, the surface of the non-processed (lower) side of each chiplet will remain as the native oxide. In an alternative embodiment, semiconductor processing is carried out on both sides of the semiconductor wafer (e.g., the lower surface of the wafer is processed to include interconnects, and the upper surface is processed as described above to include the charge-encoding structures).

According to another alternative embodiment of the present invention, singulation and release of the chiplets is conducted before one of the two charge-inducing material structures (e.g., the self-assembled OTS monolayer 150) is formed, and before the sacrificial sacrificial metal mask (e.g., MoCr mask 130) is removed. The omitted charge-inducing material structure (e.g., the self-assembled OTS monolayer) is then deposited onto the chiplets, for example, by immersing the chiplets into a preliminary solution containing OTS, and then the sacrificial charge including pattern (e.g., MoCr) mask is etched away using a second solution that doesn't affect the OTS (e.g., a ceric ammonium nitrate based etchant). This alternative approach has the potential benefit of allowing the chiplets to be fully coated with the self-assembled OTS monolayer (i.e., expect in the region where the sacrificial MoCr mask was removed). However, drawbacks to this alternative approach include increasing the difficulty of inspecting the chiplets during the final process steps (i.e., due to their release from the carrier substrate), as well as potential damage caused by chiplet-to-chiplet collisions during immersion in the preliminary solution.

Although the present invention has been described with respect to certain specific embodiments, it will be clear to those skilled in the art that the inventive features of the present invention are applicable to other embodiments as well, all of which are intended to fall within the scope of the present invention. For example, two optional approaches to the disclosed singulation process may be used (and may be preferable), i.e., in place of adhering an already thin wafer to a carrier substrate, etching through to singulate and then releasing. One option is to build the structure on a thick wafer, then singulation trenches are etched down to the desired final chip thickness using the singulation mask, and then the wafer is turned over and polished down to the trenches, thereby releasing the chips. This approach has the benefit of not requiring the carrier substrate, and simplifies handling of the wafer. The second option is to use a silicon on insulator (SOI) wafer, which is a thick, easy to handle silicon wafer with an implated oxide layer just below the surface (the depth of the implanted oxide layer will define the chiplet thickness). The structure can then be built on this, trenches etched down using the singulation mask to the implanted oxide layer, and then the chips can be released by etching away the implanted oxide. The benefits of this method are easy handling and the potential for making very thin chips.

The invention claimed is:

1. A method for fabricating a charge-encoded microelectronic component, the method comprising:
   forming a first charge-inducing material structure on an upper surface of said microelectronic component, said first charge-inducing material structure having a first surface chemistry exhibiting a first polarity;
   forming a sacrificial metal mask over a first portion of said first charge-inducing material structure such that a second portion of said first charge-inducing material structure is exposed by said sacrificial metal mask;
   forming a second charge-inducing material structure on the exposed second portion of said first charge-inducing material structure, said second charge-inducing material structure having a second surface chemistry exhibiting a second polarity; and
   removing said sacrificial metal mask, whereby said upper surface includes a first region having the first polarity, and a second region having the second polarity,
   wherein forming said first charge-inducing material structure comprises depositing a hydrophylic material, and
   wherein forming said second charge-inducing material structure comprises depositing a hydrophobic material.

2. The method of claim 1, wherein forming said first charge-inducing material structure comprises forming a layer of SiO₂ over the upper surface of said microelectronic component.

3. The method of claim 1, wherein forming said second charge-inducing material structure comprises forming a self-assembled layer.

4. The method of claim 3, wherein forming said self-assembled layer comprises forming a monolayer comprising a hydrophobic aliphatic material.

5. The method of claim 3, wherein forming said self-assembled layer comprises forming a monolayer consisting of octadecyltrichlorosilane (OTS).

6. A method for fabricating a charge-encoded microelectronic component, the method comprising:
   forming a first charge-inducing material structure on an upper surface of said microelectronic component, said first charge-inducing material structure having a first surface chemistry exhibiting a first polarity;
   forming a sacrificial metal mask over a first portion of said first charge-inducing material structure such that a second portion of said first charge-inducing material structure is exposed by said sacrificial metal mask;
   forming a second charge-inducing material structure on the exposed second portion of said first charge-inducing material structure, said second charge-inducing material structure having a second surface chemistry exhibiting a second polarity; and
   removing said sacrificial metal mask, whereby said upper surface includes a first region having the first polarity, and a second region having the second polarity,
   the method further comprising:
   fabricating an integrated circuit on a semiconductor substrate; and
   forming interconnect structures over the integrated circuit such that the interconnect structures are operably electrically connected to the integrated circuit and are disposed on said upper surface, wherein each said interconnect structure comprises one of Titanium-Tungsten (TiW) alloy or Aluminum (Al), wherein forming said first charge-inducing material structure comprises forming a layer of $SiO_2$ over the upper surface, and patterning the $SiO_2$ layer using a buffered oxide etchant such that the interconnect structures are exposed through openings defined in the $SiO_2$ layer.

7. The method of claim 6, wherein forming the interconnect structures comprises sputtering one of Titanium-Tungsten (TiW) alloy or Aluminum (Al), and wherein forming the sacrificial metal mask comprises forming a layer of Molybdenum-Chromium (MoCr) alloy over a first portion of said $SiO_2$ layer, and then etching the MoCr alloy.

8. The method of claim 7, wherein forming said self-assembled monolayer comprises disposing said microelectronic component in a solution containing octadecyltrichlorosilane (OTS) and tolumene.

9. The method of claim 7, wherein fabricating the integrated circuit comprises utilizing a fabrication complementary metal-oxide-semiconductor (CMOS) fabrication system, and wherein said forming the interconnect structures, forming said first charge-inducing material structure, and forming the sacrificial metal mask comprises utilizing the CMOS fabrication system.

10. A method for fabricating a charge-encoded microelectronic component, the method comprising:

forming a first charge-inducing material structure on an upper surface of said microelectronic component, said first charge-inducing material structure having a first surface chemistry exhibiting a first polarity;

forming a sacrificial metal mask over a first portion of said first charge-inducing material structure such that a second portion of said first charge-inducing material structure is exposed by said sacrificial metal mask;

forming a second charge-inducing material structure on the exposed second portion of said first charge-inducing material structure, said second charge-inducing material structure having a second surface chemistry exhibiting a second polarity; and removing said sacrificial metal mask, whereby said upper surface includes a first region having the first polarity, and a second region having the second polarity, the method further comprising:

fabricating an integrated circuit on a semiconductor substrate before forming said first charge-inducing material structure on said upper surface over said integrated circuit; and after forming said sacrificial metal mask and before forming said second charge-inducing material structure:

forming a singulation etch mask over the upper surface;

bonding said semiconductor substrate to a carrier substrate using a temporary mounting adhesive;

etching through said semiconductor substrate in a peripheral region surrounding said integrated circuit; and removing the singulation etch mask from the upper surface.

11. The method of claim 10, wherein forming said singulation etch mask comprises depositing a layer comprising Nickel (Ni), and wherein removing the singulation etch mask comprises etching the Ni layer using at least one of thiourea, sodium n-nitrobenzenesulfonate and sulfuric acid.

12. The method of claim 10, wherein forming said second charge-inducing material structure and removing said sacrificial metal mask are performed while said substrate remains bonded to said carrier substrate.

13. The method of claim 10, further comprising separating said substrate from said carrier substrate before forming said second charge-inducing material structure and removing said sacrificial metal mask.

14. The method of claim 13, wherein forming said second charge-inducing material structure comprises disposing said microelectronic component in a solution containing octadecyltrichlorosilane (OTS) such that said OTS forms a coating over an entire peripheral surface of said microelectronic component.

15. A method for producing a microchip ink including a plurality of a microelectronic components, the method comprising:

fabricating a plurality of integrated circuits on a semiconductor wafer;

forming a plurality of first charge-inducing material structures on an upper surface of said semiconductor wafer such that each said first charge-inducing material structure is disposed over an associated said integrated circuit, wherein each said first charge-inducing material structure includes a first surface chemistry exhibiting a first polarity;

forming a plurality of sacrificial metal masks on the upper surface such that each said sacrificial metal mask is disposed over a first portion of an associated said first charge-inducing material structure, and such that a second portion of each said first charge-inducing material structure is exposed by said associated sacrificial metal mask;

singulating the semiconductor wafer to form said plurality of microelectronic components such that each said microelectronic component includes an associated said integrated circuit disposed on a discrete semiconductor wafer chip;

forming a plurality of second charge-inducing material structures on the upper surface of each of said plurality of microelectronic components such that each said second charge-inducing material structure is disposed on the exposed second portion of said associated first charge-inducing material structure, wherein each said second charge-inducing material structure includes a second surface chemistry exhibiting a second polarity;

removing said sacrificial metal mask, whereby said upper surface of each said integrated circuit includes a first region having the first polarity, and a second region having the second polarity; and disposing said plurality of microelectronic components into a carrier solution.

* * * * *